(12) United States Patent
Takekuma

(10) Patent No.: US 7,470,936 B2
(45) Date of Patent: Dec. 30, 2008

(54) LIGHT EMITTING DIODE WITH A STEP SECTION BETWEEN THE BASE AND THE LENS OF THE DIODE

(75) Inventor: Akira Takekuma, Tokyo (JP)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 11/684,473

(22) Filed: Mar. 9, 2007

(65) Prior Publication Data

US 2008/0217642 A1 Sep. 11, 2008

(51) Int. Cl.
*H01L 29/26* (2006.01)
(52) U.S. Cl. .............................. 257/98; 257/88; 257/99; 257/100; 257/E25.032
(58) Field of Classification Search .................. 257/98, 257/88, 99, 100, E25.032
See application file for complete search history.

(56) References Cited

U.S. PATENT DOCUMENTS 6,061,160 A * 5/2000 Maruyama ................. 398/201
2005/0135105 A1 * 6/2005 Teixeira et al. .............. 362/294
2007/0201225 A1 * 8/2007 Holder et al. ............... 362/227
2007/0281050 A1 * 12/2007 Koga et al. ................. 425/234

FOREIGN PATENT DOCUMENTS

JP 2000-190560 * 7/2000

* cited by examiner

*Primary Examiner*—Evan Pert
*Assistant Examiner*—Tan N Tran

(57) ABSTRACT

It is to be made easy to arrange light emitting diodes, each including a lens having a hemispherical light emitting surface, and cover the base of the light emitting diodes with resin material.

A light emitting diode 1 has a light emitting element 2, a lead section 3 that supplies power to the light emitting element 2, a base 4 that covers the lead section 3, a lens 5 having a convex light emitting surface and connected to the base 4 to cover the light emitting element 2, and a step section 6 disposed such that it surrounds the outer side of the lens 5, part of the step 6 having a different width. The step section 6 has a height that defines the amount of resin material enough to cover the lead section 3. There is also provided a light emitting diode display device 10 using a plurality of such light emitting diodes.

7 Claims, 3 Drawing Sheets

LIGHT EMITTING DIODE WITH A STEP SECTION BETWEEN THE BASE AND THE LENS OF THE DIODE

TECHNICAL FIELD

The present invention relates to a light emitting diode (hereinafter referred to as "LED") to be used in a display, such as an outdoor display.

BACKGROUND ART

A plurality of LEDs, each including a lens having a convex light emitting surface (or a bullet-shaped lens) and fixed to a base, are used as an outdoor display. FIGS. 5A and 5B show such a conventional LED. FIG. 5A is a top view of a conventional LED 100 having a convex lens, and FIG. 5B is a front view of the LED shown in FIG. 5A viewed from the direction Y. As shown in FIGS. 5A and 5B, the conventional LED 100 includes an LED element 20, a lead section or a lead frame 30 connected to the LED element 20, and a base 40 that supports a convex lens 50 that covers the LED element 20.

When a plurality of the LEDs 100 described above are used to form an LED display device 200, black resin material is generally provided in the gaps among the LEDs 100 in order to prevent reduction in contrast due to reflection of light from the base 40.

An example of the LED 100 with the resin material described above and the LED display device 200 is, for example, an LED described in Patent Document 1. This document describes as, conventional art, a light emitting diode lamp (light emitting diode display device) in which a plurality of LEDs, each having a convex lens, are disposed on a substrate and black resin material is injected in the gap between the LEDs.

In general, when resin material is injected into the gaps among a plurality of arranged LEDs, it is difficult to check that a desired amount of resin material (or the amount that provides an appropriate height) has been injected. In particular, if the resin material comes into contact with the convex lens (light emitting surface) when the resin material is injected, the surface tension of the resin material shapes the surface of the resin material into a meniscus at the portion where the resin material is in contact with the lens, as shown in FIG. 6. Then, the resin material 110 may cover the lens 50, which is the light emitting surface, in such a way that the height of the resin material is higher than the desired height. In this case, light emitted from the lens will be absorbed by the resin material, resulting in reduced contrast and a narrower viewing angle.

[Patent Document 1] Japanese Patent Laid-Open No. 6-85329

DISCLOSURE OF THE INVENTION

Problems to be Solved by the Invention

The present invention allows resin material to be easily filled when the resin material is used to cover a base of an LED with a lens having a hemispherical light emitting surface.

Means for Solving the Problems

The present invention provides a light emitting diode including a base, a lens disposed on the base, the lens having a hemispherical light emitting surface, and a step section disposed between the base and the lens, the step section having a diameter larger than that of the lens.

In an aspect of the light emitting diode, the step section has a cutout or a protrusion. In another aspect of the light emitting diode, the lens and the step section are integrally formed. In another aspect of the light emitting diode, the area of the step section viewed from the light emitting surface side in the direction perpendicular to the base is one half or less of the remaining area of the base excluding the footprint of the lens. In another aspect of the light emitting diode, the position of the cutout indicates the polarity of the light emitting diode.

The present invention further provides a light emitting diode display device including a plurality of the light emitting diodes according to any of the above aspects, wherein resin material is injected in the gap between the light emitting diodes, the amount of the resin material defined by the height of the step section.

The present invention further provides a method for manufacturing a light emitting diode including the steps of attaching an light emitting element and a lead section to a base, the lead section supplying power from a power supply, attaching a lens having a hemispherical light emitting surface to the base in such a way that the lens covers the light emitting element, and providing a step section having a height that defines the amount of resin material enough for covering the lead section, part of the step section having a different width, in such a way that the step section surrounds the outer side of the lens. A preferred aspect of the method further includes a step of integrally forming the step section and the lens. By thus integrally machining and forming the step section and the lens (for example, using technologies, such as injection molding, extrusion, casting, molding, cutting and light radiation), the efficiency of assembling operation can be improved, resulting in lower manufacturing cost.

ADVANTAGE OF THE INVENTION

According to the present invention, the step section which is provided around the out side of the lens having a hemispherical light emitting surface and which projects from the base prevents the resin material from being in direct contact with the lens. The height of the step section defines the amount of the resin material enough for reliably covering the lead section and the base of the LEDs. The cutout provided in the step section allows the operator to easily check that the amount of the resin material being injected is approaching a predetermined level. In this way, an appropriate amount of resin material can easily be injected, so that there is provided an LED that solves problems, such as reduced contrast and a narrower viewing angle. Furthermore, a plurality of the LEDs described above can be used to provide an LED display device with increased contrast and a wider viewing angle usable as an outdoor display.

BEST MODE FOR CARRYING OUT THE INVENTION

FIGS. 1A and 1B show a light emitting diode 1 used to implement the present invention. FIG. 1A shows the LED used to implement the present invention when viewed toward the light emitting surface side of the lens in the direction perpendicular to the base. FIG. 1B shows the LED shown in FIG. 1A when viewed in the direction X (direction parallel to the base).

The light emitting diode 1 includes a light emitting element 2, such as an LED element, a lead section or lead frame 3 that supplies power to the light emitting element 2, a base 4 that covers the lead section 3, a lens 5 having a hemispherical light emitting surface and connected to the base 4 to cover the light emitting element 2, and a step section 6 disposed such that it surrounds the outer side of the lens 5, part of the step section 6 having a different width. The step section 6 has a height that defines the amount of resin material enough for covering the lead section or lead frame 3 and the base 4.

FIG. 2 shows an LED display device 10 fabricated by using a plurality of the LEDs 1 shown in FIG. 1 and injecting resin material 7, the amount of which is defined by the step section 6 of the LED 1. The step section 6 prevents the resin material 7 injected to cover the base 4 from being in contact with the lens 5. As shown in FIG. 2, when the resin material 7 is injected approximately to the height of the step section 6, the surface tension of the resin material 7 raises the portion of the resin material 7 that is in contact with the step section 6 in such a way that the height of the portion is higher at a position more apart from the step section 6. This structure is advantageous compared to conventional LEDs in that even when the amount of the resin material 7 to be injected is slightly larger, the structure unlikely affects the characteristics of the LED 1 and the display device 10 using the LEDs 1.

FIG. 3 shows an aspect in which the step section 6 of the LED 1 has a cutout. FIG. 3 shows cutouts 60A and 60B. The cutouts 60A and 60B can be configured such that the positions of the cutouts 60A and 60B indicate the polarities of the LED 1. The polarities used herein may include the positions of positive and negative electrodes. In this way, an operator can easily know the polarities of the LED.

As shown in FIG. 4, by judging whether or not the resin material 7 reaches the cutouts 60A and 60B, the operator can easily know that the amount of the resin material 7 being injected is approaching an appropriate level.

In FIGS. 3 and 4, although the description has been made of the case where the cutouts 60A and 60B are provided, the structure of the step section 6 is not limited thereto. For example, a protrusion may be provided on the step section 6.

In the above description, the LED 1 used to implement the present invention and the display device 10 using the same have been described only by way of example. To implement the present invention set forth in the claims, it should be understood that those skilled in the art apparently recognize that a large number of device configurations different from the device configuration described above can be employed.

BRIEF DESCRIPTION OF THE DRAWINGS

FIG. 1A shows an LED used to implement the present invention when viewed from the light emitting surface side in the direction perpendicular to a base, and FIG. 1B shows the LED shown in FIG. 1A when viewed in the direction X.

FIG. 2 is a cross-sectional view of an LED display device in which a plurality of the LEDs shown in FIG. 1 are used and resin material is injected, the amount of which is defined by the step sections of the LEDs.

FIG. 3 is a top view showing an aspect in which the step section of the LED shown in FIG. 1 has cutouts indicating the polarities of the LED.

FIG. 4 is a top view showing an aspect in which resin material has been injected around the LED shown in FIG. 3.

FIG. 5A is a top view of a conventional LED having a convex lens, and FIG. 5B is a front view of the LED shown in FIG. 5A viewed from the direction Y.

FIG. 6 is a cross-sectional view of an LED display device in which a plurality of the conventional LEDs shown in FIG. 5 and resin material is injected in the gap between the LEDs.

Figure 1:
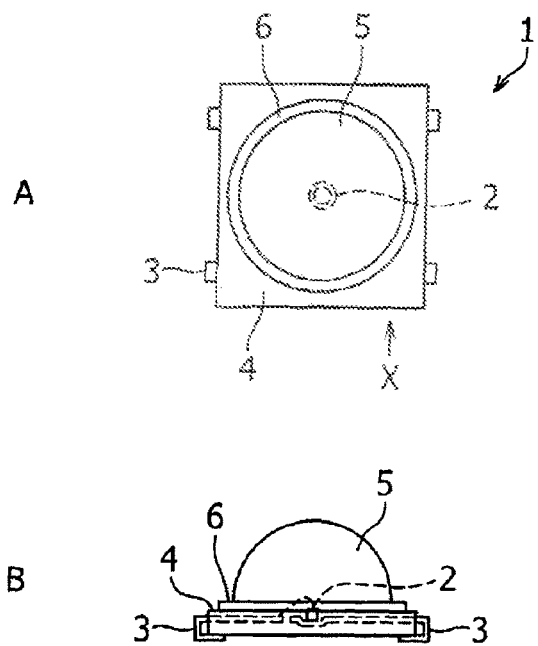
[FIG. 1]
Figure 2:
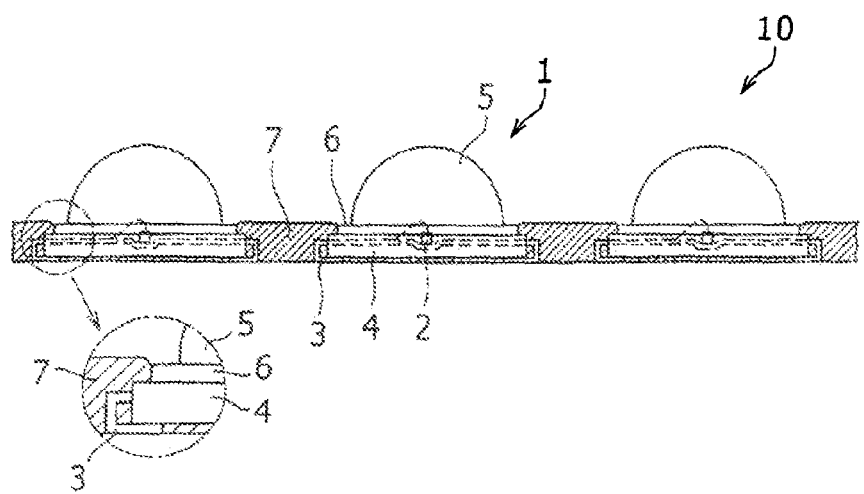
[FIG. 2]
Figure 3:
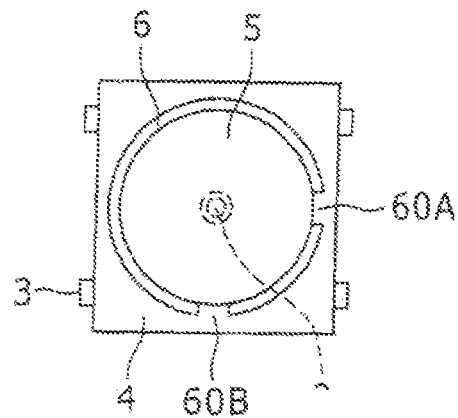
[FIG. 3]
Figure 4:
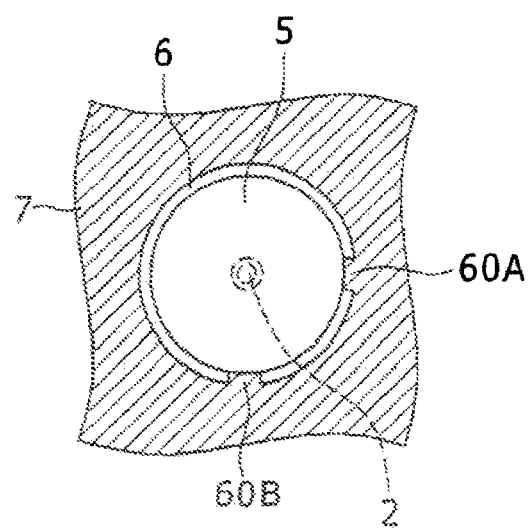
[FIG. 4]
Figure 5:
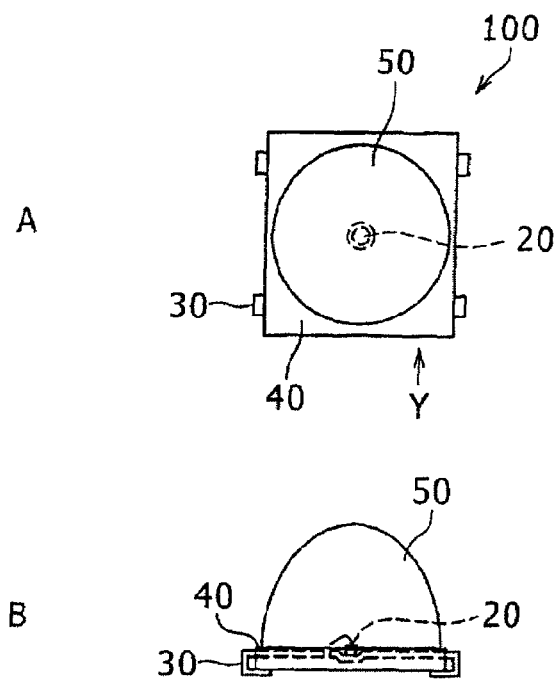
[FIG. 5]
Figure 6:
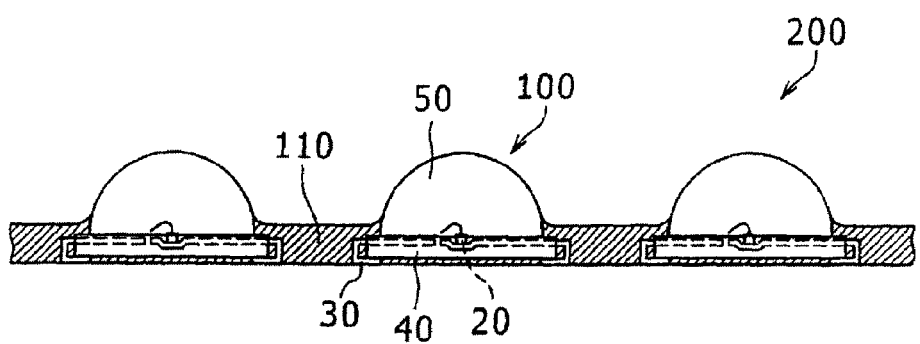
[FIG. 6]

The invention claimed is:

1. A light emitting diode comprising:
   a leadframe;
   a light emitting element positioned on the leadframe;
   a base configured to cover the leadframe such that portions of the leadframe extend from the base,
   a lens disposed on the base, the lens having a hemispherical light emitting surface, and
   a step section disposed between the base and the lens, the step section having a diameter larger than that of the lens and smaller than a length or a width of the base.

2. The light emitting diode according to claim 1, wherein the step section has a cutout or a protrusion.

3. The light emitting diode according to claim 2, wherein the position of the cutout or the protrusion indicates the polarity of the light emitting diode with respect to positive and negative electrodes of the light emitting diode.

4. The light emitting diode according to claim 1 or 2, wherein the lens and the step section are integrally formed.

5. The light emitting diode according to any of claims 1 to 4, wherein the area of the step section viewed toward a light emitting surface side of the lens in the direction perpendicular to the base is one half or less of the remaining area of the base excluding the footprint of the lens.

6. A light emitting diode display device comprising a plurality of the light emitting diodes according to claim 1, wherein resin material is injected into gaps between the light emitting diodes in such a way that the resin material is in contact with the step section of each of the light emitting diodes.

7. The light emitting diode display device according to claim 6 wherein the height of the resin material injected into the gaps between the light emitting diodes is approximately equal to the height of the step section of each of the light emitting diodes.

* * * * *